United States Patent [19]

Dunkleberger

[11] 4,218,532
[45] Aug. 19, 1980

[54] PHOTOLITHOGRAPHIC TECHNIQUE FOR DEPOSITING THIN FILMS

[75] Inventor: LaRue N. Dunkleberger, High Bridge, N.J.

[73] Assignee: Bell Telephone Laboratories, Incorporated, Murray Hill, N.J.

[21] Appl. No.: 841,797

[22] Filed: Oct. 13, 1977

[51] Int. Cl.$^2$ .................. G03C 5/00; G03C 11/00
[52] U.S. Cl. ................... 430/314; 430/317; 430/318; 430/324; 430/326; 430/327; 430/394; 430/502; 156/661.1
[58] Field of Search .............. 96/38.4, 36.1, 36.2, 96/67, 68; 156/661; 427/240, 241, 88, 282, 99, 251, 295, 296, 425; 118/307, 310, 319

[56] References Cited

U.S. PATENT DOCUMENTS

| | | | |
|---|---|---|---|
| 3,148,085 | 9/1964 | Wiegmann | 427/282 |
| 3,542,551 | 11/1970 | Rice | 96/38.4 |
| 3,799,777 | 3/1974 | O'Keefe et al. | 96/38.4 |
| 3,849,136 | 11/1974 | Grebe | 96/36.2 |
| 3,873,361 | 3/1975 | Franco et al. | 96/36 X |

OTHER PUBLICATIONS

Grebe, K., Ames, I., Ginzberg A., Journal of Vacuum Science Technology, vol. 11, No. 1, Jan./Feb. 1974.

*Primary Examiner*—Edward C. Kimlin
*Attorney, Agent, or Firm*—Michael J. Urbano

[57] ABSTRACT

A lift-off mask for the patterned deposition of thin films comprises a three layer sandwich of photoresist-aluminum-photoresist on a substrate. Deposition occurs through an opening in the top photoresist layer and through larger size (i.e., undercut) openings in the aluminum and bottom photoresist layers. The top layer of photoresist remains on the mask during deposition and defines the pattern, the bottom photoresist is fully exposed and in the openings provides an undercut which prevents edge tearing during lift-off, and the aluminum layer (typically 50–200 Angstroms thick) protects the bottom layer of photoresist from dissolving during formation of the top photoresist layer. Also described is a technique in which the edges of thin films are tapered by depositing them from a direction oblique to the substrate surface and by rotating the substrate during deposition. These techniques are specifically discussed in the context of fabricating Josephson junction devices.

12 Claims, 18 Drawing Figures

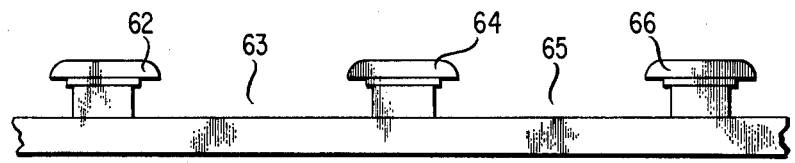
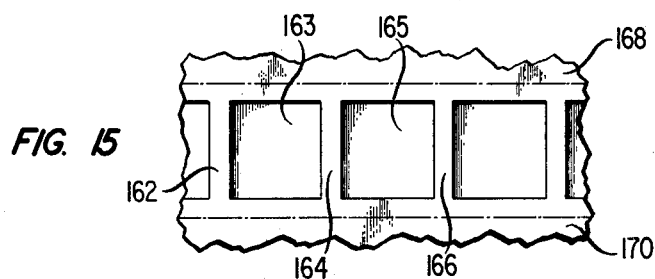
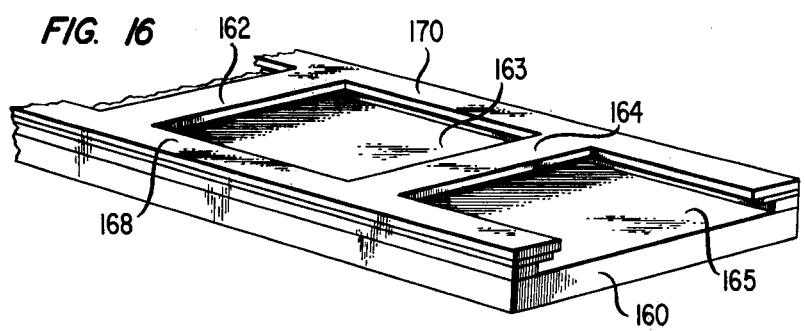
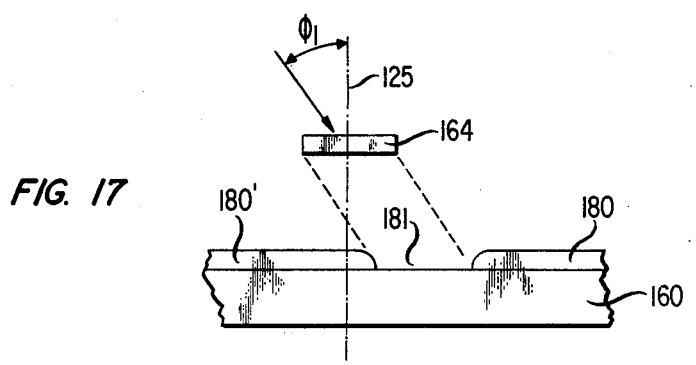
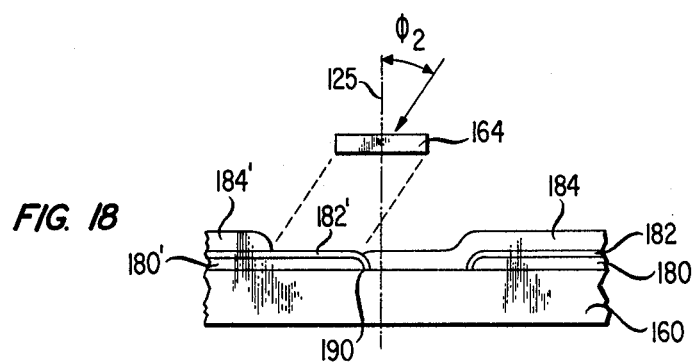

PHOTOLITHOGRAPHIC TECHNIQUE FOR DEPOSITING THIN FILMS

BACKGROUND OF THE INVENTION

This invention relates to the deposition of thin films on selected areas of a substrate.

Many electronic circuits, such as those incorporating Josephson junction logic and memory devices, include multi-level patterned thin films of resistors, insulators, oxides, and metals formed from a variety of materials such as tin, lead, silver, gold, silicon monoxide, germanium and aluminum. Defining most of these patterns by the commonly used methods (for example, chemically etching or ion milling an evaporated thin film in the presence of a protective photoresist layer) is generally undesirable because of the possible incompatibility of previously defined layers with the etchants or ion beam. This incompatibility has led to a number of stencil or lift-off techniques in which the patterns are defined by evaporating a thin film through a window in a photoresist layer and then removing the undesired material by swelling or dissolving the underlying resist in a suitable stripper. Although these methods alleviate the passivation problems associated with wet or dry etching of the thin films, lift-off produces torn edges (burrs) and/or very sharp edges which can cause shorts in junctions, shorts through crossovers or open circuits in patterned films. However, creating a reverse bevel in the photoresist or an undercut stencil is known to eliminate the torn edges.

A stencil technique employing a reverse bevel in the fabrication of Josephson junction devices is described by K. Grebe et al in *Journal Vac. Science Technology*, Vol. 11, p 458 (1974) and by K. Gebe in U.S. Pat. No. 3,849,136 issued on Nov. 19, 1974. The Grebe et al and Grebe (hereinafter Grebe) technique employs a three layer sandwich comprising two spin coated layers of positive photoresist about 1.5 $\mu$m thick separated by a 1 $\mu$m layer of evaporated aluminum. When exposed by conventional photoresist exposure equipment, the top layer of photoresist has windows opened in it which correspond to the desired thin film pattern to be evaporated. This patterned resist layer masks the aluminum layer so that the negative image of the final pattern can be etched in the aluminum layer by a suitable acid etchant. During this etch the bottom layer of photoresist protects any previously defined patterns. The bottom layer of photoresist is then grossly overexposed through the aluminum mask so that after development this layer of photoresist undercuts the aluminum by $\gtrsim 1$ $\mu$m. During the overexposure step the top photoresist layer is also exposed and subsequently developed away, leaving the patterned aluminum film as a proximity shadow mask supported 1 $\mu$m off the substrate by the bottom photoresist layer. The desired material, up to 1 $\mu$m in thickness, is now evaporated through the windows in the aluminum mask with the undercut in the resist preventing the patterned film from being torn during lift-off of the stencil. A soak of the sample in acetone for about ½ hour causes the aluminum mask and all the undesired material to lift-off as the underlying layer of photoresist is dissolved.

Because the Grebe method uses an etched aluminum layer as the means of pattern definition, etching of the aluminum is a very critical and limiting factor. Nonuniformity of the etching process over the area of the substrate causes some patterns to undercut the resist layer before others have been completely etched out, resulting in dimensional distortion of comparably sized patterns on the substrate. Other problems with this method are the limited resolution associated with etching very small patterns through a 1 $\mu$m aluminum layer, and the difficulty in aligning previous patterns through the 1 $\mu$m aluminum layer due to lack of contrast (i.e., low transparency). However, the use of an aluminum layer substantially thinner than 1 $\mu$m (0.01–0.10 $\mu$m, for example) is, as a practical matter, not feasible because a certain minimum thickness is required to prevent the unsupported aluminum layer overhang from breaking off during processing.

Another advantage of the Grebe method is that relatively pronounced undercuts (e.g., >1 $\mu$m) can be attained only by a very long exposure (e.g., 10 minutes) of the bottom photoresist. However, long exposure times cause two problems. First, the bottom photoresist swells and distorts the stencil causing a further loss of resolution. Second, a fine residue remains in the vicinity of the edges of the deposited thin film after removal of the stencil and is not as easily removed by immersion in a developer as claimed by Grebe.

SUMMARY OF THE INVENTION

A deposition mask in accordance with one aspect of my invention is also a three layer sandwich of, for example, photoresist-aluminum-photoresist, but in contrast with Grebe the top layer of photoresist remains on the mask during deposition and defines the pattern, the bottom photoresist is fully exposed and provides the undercut, and the aluminum layer (typically 50–200 Angstroms thick) merely provides an intermediate layer which protects the bottom photoresist layer from dissolving during formation of the top photoresist layer.

In accordance with a broader aspect of my invention, patterned thin films, such as metals or insulators, are deposited on a substrate using the foregoing three layer sandwich mask as follows: (1) a first layer of photosensitive material which can be patterned (e.g., a positive photoresist) is formed on the substrate; (2) the entire first layer is exposed to suitable optical radiation to render it soluble in a developer; (3) a protective second layer is formed on the first layer from a material (e.g., a metal such as aluminum) which protects the first layer from dissolution during subsequent formation of a photosensitive third layer; (4) the photosensitive third layer is formed on the protective second layer; (5) the third layer is patterned (e.g., by electron beam exposure techniques) to form openings therein which extend to the second layer; (6) the protective second layer is then patterned (e.g., by etching) to form openings therein which extend to the first layer, and which are substantially aligned with the openings in the third layer and at least as the openings in the third layer (7) the first layer is patterned to form openings substantially aligned with those in the second layer; and of larger size than the openings in the third layer (i.e., an under cut is formed) (8) thin films (e.g., metals such as lead alloys) are deposited (e.g., by vacuum evaporation) onto the substrate through the openings using the photosensitive third layer as a deposition mask; and (9) the first, second and third layers are removed after deposition leaving the patterned thin films on the substrate.

It should be noted that steps (1) and (2) above define in essence a layer of material which can be patterned and which during patterning is soluble in a solvent which does not attack adjacent layers, e.g., thin film layers of a previously deposited (underlying) pattern, the overlying protective second layer, or the overlying photosensitive third layer.

A feature of another embodiment of my invention resides in a modification of deposition step (8) which tapers the edges of the deposited thin films and thereby reduces the likelihood that films overlying the edges of previously deposited films will yield defective devices (e.g., shorted junctions or open resistors). The modification entails two parts: orienting the substrate so that deposition is oblique to the surface and rotating the substrate during deposition.

One of the more significant advantages of my invention compared to Grebe's method is the better resolution attained because the top layer of photoresist remains on the mask during deposition to define the pattern rather than using the etched aluminum layer to do so. Therefore, the only factors limiting resolution in my invention are the resolution of the photoresist, and the exposure equipment or the mask used, whereas Grebe's resolution is primarily limited by the smallest sized feature (e.g., 3 $\mu$m) that can be accurately etched in the 1 $\mu$m thick aluminum masking layer. For example, using my method patterns of 1.5 $\mu$m line width have been produced, which is the ultimate resolution of the master mask used.

As mentioned previously, another problem associated with etching of the aluminum masking layer in the method of Grebe is that undercutting of the aluminum layer, which also increases pattern size, does not always occur uniformly. Irregular and poor edge definition results. However, a nonuniform undercut during the aluminum etch using my invention does not significantly affect edge definition as long as the pattern-defining top photoresist layer is completely undercut.

Accurate alignment of patterns to one another through the relatively thick, and hence opaque, 1 $\mu$m aluminum layer used by Grebe can also be a difficult proposition. My invention in one of its aspects permits a much thinner aluminum layer to be used. Consequently, alignment to previous patterns is greatly facilitated because the previous patterns are much more visible (i.e., contrast is improved).

Finally, relatively pronounced undercuts can be attained by my technique without the attendant problem of distortion caused by swelling of the bottom photoresist layer and with substantially less residue remaining after lift-off of the stencil.

BRIEF DESCRIPTION OF THE DRAWING

My invention, together with its various features and advantages, can be readily understood from the following more detailed description taken in conjunction with the accompanying drawing, in which:

FIG. 14 is a schematic side view of a patterned mask depicting a plurality of openings separated by three-layer mask segments;

FIGS. 15–16 are a plan view and perspective view, respectively, of a mask in which portions of the top photoresist layer are suspended above the substrate; and FIGS. 17–18 are schematic side views showing how the suspended mask portion of FIGS. 15–16 can be employed in conjunction with oblique evaporation of thin film to form a small area Josephson junction device.

DETAILED DESCRIPTION

Lift-Off Mask Fabrication

Figure 1:
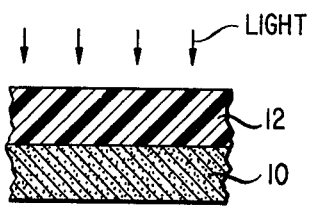
FIGS. 1–8 show in cross section the sequential development of a lift-off mask for deposition of patterned thin films in accordance with one aspect of my invention.
Figure 2:
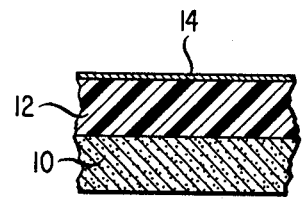
Figure 3:
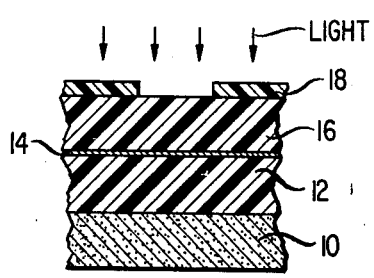
Figure 4:
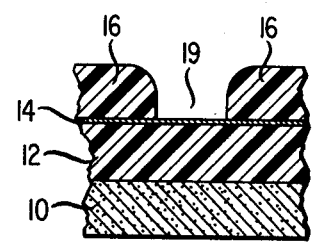

FIGS. 1–8 show the development of a three layer sandwich used as a stencil or lift-off mask in the deposition of patterned thin films such as metals, insulators, and the like. In accordance with one aspect of my invention, patterned thin films are deposited on a substrate 10 by the following technique: (1) FIG. 1: a first layer 12 of photosensitive material which can be patterned is formed on the substrate; (2) FIG. 1: the entire first layer 12 is exposed to suitable optical radiation (light) to render it soluble in a developer; (3) FIG. 2: on the first layer 12 a protective second layer 14 is formed from a material which protects the first layer 12 from dissolution during subsequent formation of a photosensitive third layer 16; (4) FIG. 3: the photosensitive third layer 16 is formed on the protective second layer; (5) FIGS. 3 and 4: the third layer 16 is patterned as shown in FIG. 3 by means of a suitable mask 18, exposure to light and a developer to form openings 19 therein which extend to the second layer 14; (6) FIG. 5: the protective second layer 14 is then patterned (e.g., by etching) to form openings 19' therein which extend to the first layer 12, and which are substantially aligned with the openings in the third layer and at least as large as the openings in the third layer; (7) FIG. 6: the first layer 12 is patterned to form openings 19" substantially aligned with those in the protective second layer 14 and of larger size than those in third layer 16 (i.e., an undercut 21 is formed); (8) FIG. 7: thin films 20 and 22 are deposited onto the substrate and the third layer 16, respectively, through the openings 19, 19', 19" using the third layer 16 as a deposition mask; and (9) FIG. 8: the three layer mask 12, 14, and 16, as well as the thin film 22 deposited thereon, are removed leaving the desired patterned thin film 20 on the substrate 10.

A feature of this technique resides in complete exposure of the first photosensitive layer before formation of the protective layer. As discussed more fully hereinafter, this feature permits the use of thinner protective layers, which improves resolution and alleviatesalignment problems, and renders the first layer soluble in ordinary developers, which in turn improves resolution because the undercut is more controllable.

Figure 7:
Figure 7:
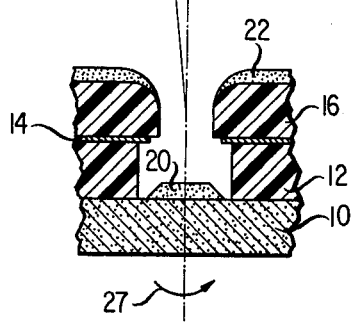
Figure 8:
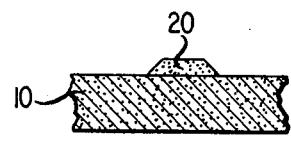

A feature of another embodiment of my invention resides in a modification of step (8) wherein the thin film 20 is deposited from a direction 23 oblique to the surface of the substrate 10 as shown in FIG. 7. For example, the deposition direction 23 is typically at an angle $\theta = 10$ degrees to the normal 25 to substrate 10. In addition the substrate 10 is rotated about its normal 25 (e.g., in the direction of arrow 27). The combination of these two modifications, oblique deposition and substrate rotation, are effective to taper the edges of the deposited thin film 20. As a consequence, the likelihood that other films (not shown) overlying an edge of film 20 will yield defective devices is greatly reduced.

In accordance with another aspect of my invention, the protective layer 14, typically a metal, is made sufficiently thin to facilitate alignment of patterns to one another. In the case of an aluminum protective layer, for example, a thickness of 50 Angstroms is suitable.

Photosensitive layers 12 and 16 are typically positive acting photoresists of the type which are rendered soluble in certain solvents after exposure to light. Generally, the photosensitive materials are organic materials, although inorganic photosensitive materials may be used. The protective layer 14 comprises any material which can be etched and which is capable of protecting the bottom photosensitive layer 12 from dissolution during the formation of the top photosensitive layer 16. Metals such as aluminum are particularly suitable since they are easily deposited by vacuum techniques and are easy to etch.

Example

The following example describes the fabrication of a three layer photoresist-aluminum-photoresist stencil used in the fabrication of Josephson junction devices and circuits. Unless otherwise stated specific parameters are given for the purposes of illustration only and should not be construed as limitations upon the scope of the invention.

With reference to FIGS. 1–8, photosensitive layers 12 and 16 comprised AZ1350J positive acting photoresist manufactured by Shipley Corporation, Newton, Massachusetts. Both of these layers were spin coated at 6,000 rpm to a thickness of about 1.5 $\mu$m. The bottom photoresist layer 12 was cured at 90 degrees C for 30 minutes and the top photoresist layer 16 was cured at 80 degrees C for 15 minutes. After the bottom photoresist layer 12 has been applied and cured, and before layers 14 and 16 were formed, the entire bottom photoresist layer was exposed to light having an energy density of about 420 mJ/cm$^2$. Since the bottom photoresist layer 12 would be dissolved during the formation of the top photoresist layer 16, a thin film of aluminum, about 100–200 Angstroms thick, was vacuum evaporated onto the bottom photoresist layer 12. Thinner protective films, or protective films of different materials, could also be used if they isolate the two photosensitive layers. For example, a 50 Angstrom thick layer 14 of aluminum has been utilized. Such a thin layer has the advantage that the undercut 21 is visible in an optical microscope, thereby enabling accurate control of etching and alignment for very fine work.

After the protective layer was evaporated, the top photoresist layer 16 was spun and cured. Patterning of the top photoresist layer 16 was accomplished by exposing it with a Cobilt Model CA400 contact printer manufactured by Cobilt, Division of Coputervision Corporation, Burlington, Massachusetts. The printer supplied light having an energy density of about 320 mJ/cm$^2$ through an EBES mask that was a negative of the desired pattern. EBES is an acronymn for electron beam exposure system.

Figure 5:
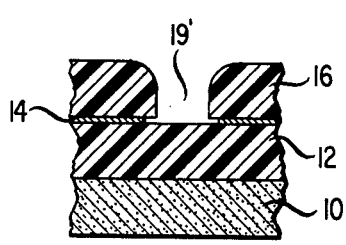

Following a 30 second development in a 1:1 developer/deionized water solution, and through rinse in deionized water, windows were etched through the aluminum layer 14 so that top photoresist layer 16 was slightly undercut as shown in FIG. 5. A suitable etchant comprises 84 percent phosphoric acid, 5 percent nitric acid, 5 percent water, 5 percent acetic acid, and 1 percent TRITON-X 400 wetting agent. Previously defined thin films (not shown) were protected from the etchant by the bottom photoresist layer 12.

Figure 6:
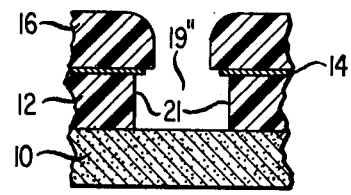

Having been previously exposed, the bottom photoresist layer 12 was then developed for 30–35 seconds in a Shipley developer diluted 1:1 with distilled water to obtain a 4 $\mu$m undercut 21 as shown in FIG. 6. The extent of this undercut can be controlled by appropriate variations in the exposure time and/or development. A thin superconductor film 20, up to 1 $\mu$m thick, was then deposited through the windows 19 in the top photoresist layer 16. Deposition took place at an angle of about 10 degrees to the substrate normal and the substrate was rotated about the normal at a speed of approximately 120 rpm. The three layer stencil was then lifted-off by soaking in acetone for about 1/8 hour, leaving a patterned thin film 20 on substrate 10 as illustratively depicted in FIG. 8.

Line patterns measuring about 10 $\mu$m × 1 mm with 10 $\mu$m spacings have been fabricated using this method. However, more closely spaced and narrower thin films can readily be made by employing a higher resolution photoresist (e.g., Shipley AZ1350B) to make the stencil.

The resolution of my invention technique is determined by the type of photoresist in layers 12 and 16, and by the exposure equipment or masked used to pattern the photoresist layers. Generally, my technique yields results that are quite comparable to those attainable with single layer photoresist patterning methods, but without the edge-tearing problems attendant those methods. In contrast with Grebe, the resolution of my technique is not significantly affected by the etching of the aluminum layer or subsequent development of the bottom photoresist layer. In fact, my technique has been successfully employed to produce patterns of 1.5 $\mu$m linewidth which was the ultimate resolution of the EBES master mask.

As line widths become narrower and narrower, accurate alignment of sequentially formed patterns in multi-level circuits is of paramount importance. Sufficient contrast is created by use of a 50 Angstrom thick aluminum film in my inventive method to provide adequate visibility of previously deposited patterns, thereby facilitating alignment. The protective aluminum layer also aids in obtaining good line uniformity because of the uniform reflection and absorption created by this layer. As a result, at points where a pattern crosses over a previously deposited thin film no changes in linewidths have been observed.

It should be noted that the attainment of the undercut 21 by developing the totally exposed bottom photoresist layer 12 is not a self-limiting process. Therefore, the exposure of the bottom photoresist layer 12 should be reduced so that the entire layer 12 is completely exposed but developed at a slow to moderate rate (e.g., about 0.05 $\mu$m/sec). In this way, adequate control of the undercut can be achieved by moderately accurate timing of the development process. Notwithstanding, however, my method on the whole is fairly tolerant of error and does not require extremely accurate control of the processing steps.

In addition, the processing of the bottom AZ1350J photoresist layer 12 should be carried out in an environment having a relative humidity in excess of about 35 percent in order for completely uniform development of this layer to occur. I have found that if processing is done at less than about 35 percent humidity, development may take much longer than would be normal for a given exposure or may occur very nonuniformly or not at all.

Josephson Junction Device Fabrication

The following description in conjunction with FIGS. 9-13 illustrates how the foregoing mask fabrication processes can be employed to make a Josephson junction device shunted by a resistor. Although such a device would typically be formed on, but electrically insulated from, a ground plane, the latter has been omitted from the following discussion in the interests of simplicity and because the processing steps to form a ground plane are well known in the art.

Figure 9:
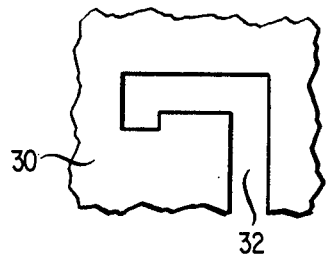
FIGS. 9–13 are plan views of masks (FIGS. 9, 11) and thin films (FIGS. 10, 12–13) deposited using those masks in the fabrication of a Josephson junction device.
Figure 10:
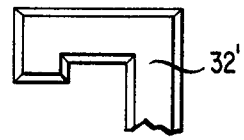

The process defined by FIGS. 1-6 is used to form a stencil 30 having an undercut, L-shaped opening 32 as shown in FIG. 9. Oblique deposition and substrate rotation as defined by FIG. 7 is utilized to deposit an L-shaped thin film superconductor 32' comprising a lead alloy. The stencil 30 is then stripped off leaving the L-shaped thin film 32' on the substrate (not shown) as depicted in FIG. 10.

Figure 11:
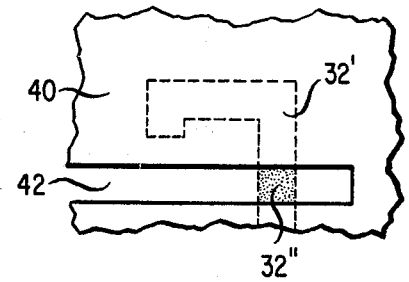
Figure 12:
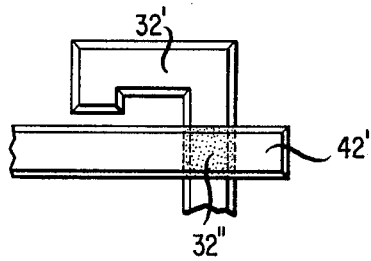

Next, the process defined by FIGS. 1-6 are repeated to form a second stencil 40 having a rectangular opening 42 therein which as shown in FIG. 11 overlaps one leg of L-shaped thin film 32' (tapered edges omitted for clarity).

Thereafter, the exposed portion 32" of the L-shaped thin film 32' is cleaned and then oxidized in a dc discharge or thermally oxidized while the substrate is being rotated. This oxide layer (not shown) forms the tunneling barrier or weak-link of the Josephson junction.

Next, using oblique deposition and substrate rotation, a rectangular thin film superconductor 42, also comprising a lead alloy, is deposited through the stencil 40. The stencil 40 is then lifted off leaving the completed Josephson junction device depicted in FIG. 12.

Figure 13:
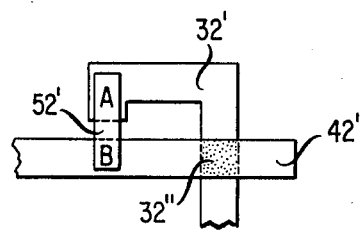

Following the foregoing procedures, a third stencil can be formed having a rectangular opening overlapping regions A and B of thin films 32' and 42' shown in FIG. 13. Deposition of a thin film of normal metal through the opening forms a resistor 52' shunting the junction 32". As is well known in the art, such a resistor is useful for a number of purposes (e.g., damping). Note that in FIG. 13, the tapered edges of the films 32', 42' and 52' have been omitted for simplicity.

Suspended Photoresist Stencil

The three-layer stencil depicted in FIG. 6 is only a portion of a much larger stencil which in practice would have a plurality of openings for depositing a plurality of thin films. FIG. 14 illustrates in two dimensions how openings 63 and 65 would be defined by spaced stencil portions 62, 64 and 66 formed on substrate 60 in accordance with the foregoing technique.

Openings 63 and 65 can take on a variety of geometric shapes such as the squares 163 and 165 shown in FIGS. 15 and 16. In addition, if the bottom photoresist layer is developed sufficiently, it will be completely removed in certain adjoining areas leaving photoresist bridges 162, 164 and 166 suspended between three-layer stencil segments 168 and 170 acting as supports on substrate 160. Although not shown in FIG. 16, the aluminum protective layer would be present beneath the suspended portions of photoresist as well as in the support segments.

The suspended bridge mask can advantageously be combined with oblique deposition to form overlapping thin films for numerous device applications such as, for example, small area (e.g., $\frac{1}{2}\mu m^2$) Josephson junctions.

FIGS. 17 and 18 illustrate the procedure as it relates to bridge 164 of FIG. 16. As shown in FIG. 17, evaporation from a source direction which is oriented at an angle $\Phi_1$ to the normal 125 to substrate 160 results in the deposition of bifurcated superconductor films 180 and 180' separated by a gap 181 whose size is a function the width and thickness of bridge 164. Thus, bridge 164 acts as a shadow mask.

To fabricate a Josephson junction a tunneling barrier would now be formed as shown in FIG. 18. For example, oxidizing the thin film results in the formation of thin oxide layers 182 and 182' on thin films 180 and 180', respectively. Next, evaporation from of a source direction $\Phi_2$ on the opposite side of normal 125 results in the deposition of bifurcated superconductor films 184 and 184'. By making $\Phi_1 \simeq \Phi_2$ a small area tunneling junction can be formed at the joint 190 where superconductor film 184 abuts oxide layer 182'.

On the other hand, if $\Phi_2 < \Phi_1$, a gap, smaller than that proscribed by the dimensions of bridge 164, would be formed between film 180' and film 184—with or without the intermediate formation of a barrier layer.

It is to be understood that the above-described arrangements are merely illustrative of the many possible specific embodiments which can be devised to represent application of the principles of our invention. Numerous and varied other arrangements can be devised in accordance with these principles by those skilled in the art without departing from the spirit and scope of the invention. In particular, while my invention has been described in terms of fabricating Josephson junction devices, it will be apparent that it has broader application in the deposition of thin films in general. Moreover, while tapered thin film edges were described herein as being attained by oblique deposition and substrate rotation, it is possible to achieve similar results by depositing from an extended source rather than a "point" source.

What is claimed is:

1. A method of depositing patterned thin films on a substrate comprising:
   (1) forming on said substrate a first layer of positive-acting photoresist material which can be patterned after exposure to optical radiation and which is soluble in a solvent which does not attack adjacent layers; and exposing said entire first layer to said radiation prior to step (2);
   (2) forming a protective second layer on said first layer to a thickness in the range of approximately 50-200 Angstroms effective to protect it from dissolution during the subsequent formation of the positive-acting photoresist of step (3);
   (3) forming a positive-acting photoresist third layer on said second layer;
   (4) patterning said positive-acting photoresist third layer to form openings therein which extend to said second layer;
   (5) patterning said second layer to form openings therein which extend to said first layer, and which are substantially aligned with said openings in said third layer and at least as large as said openings in said third layer;
   (6) patterning said first layer by exposure to said solvent, without removing said third layer, to form openings therein in substantial alignments with said openings in said third layer and of larger size than said openings in said third layer; and (7) depositing said thin films onto said substrate through said openings using said positive-acting photoresist third layer as a deposition mask.

2. The method of claim 1 wherein said protective layer comprises an etchable material.

3. The method of claim 1 wherein said protective layer has a thickness in the range of approximately 50-200 Angstroms.

4. The method of claim 3 wherein said protective layer comprises a layer of aluminum approximately 50 Angstroms thick so as to render it optically transparent.

5. The method of claim 1 including removing said first, second, and third layers after depositing said thin films in step (7).

6. The method of claim 1 wherein said protective layer is vacuum deposited.

7. The method of claim 1 wherein during step (7) said depositing occurs from a direction oblique to said substrate and said substrate is rotated during deposition.

8. The method of claim 1 wherein during step (1) said first layer is fabricated in an environment having a humidity in excess of approximately 35 percent.

9. The method of claim 1 wherein said deposited thin film is metallic.

10. The method of claim 1 wherein said deposited thin film is insulative.

11. A method of depositing patterned thin films on a substrate comprising:

(1) forming on said substrate a first layer of positive-acting photoresist material;

(2) exposing said entire first layer to optical radiation;

(3) vacuum depositing an aluminum second layer on said first layer to a thickness in the range of approximately 50-200 Angstroms effective to protect said first layer from dissolution during the subsequent formation of the positive-acting photoresist third layer of step (4):

(4) forming a positive-acting photoresist third layer on said second layer;

(5) patterning said third layer to form openings therein which extend to said second layer;

(6) etching said second layer to form openings therein which extend to said first layer, and which are substantially aligned with said openings in said third layer and at least as large as said openings in said third layer;

(7) patterning said positive-acting photoresist first layer, without removing said third layer, to form openings therein in substantial alignment with said openings in said third layer and of larger size than said openings in said third layer;

(8) depositing said thin films onto said substrate through said openings using said positive-acting photoresist third layer as a deposition mask;

(9) concurrent with said depositing step (8), rotating said substrate and depositing said thin films from a direction oblique to said substrate; and

(10) removing said first, second, and third layers after depositing said thin films.

12. The method of claim 11 wherein said first layer is deposited in an atmosphere having a humidity in excess of approximately 35 percent.

* * * * *